United States Patent
Shinn et al.

(10) Patent No.: US 7,929,101 B2
(45) Date of Patent: Apr. 19, 2011

(54) FLEXIBLE DISPLAY PANEL HAVING PARTICULAR ANISOTROPIC CONDUCTIVE FILM

(75) Inventors: Ted-Hong Shinn, Hsinchu (TW); Jen-Shiun Huang, Hsinchu (TW); Chen-Lung Lo, Hsinchu (TW); Yuan-Chih Tsai, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 376 days.

(21) Appl. No.: 12/252,437

(22) Filed: Oct. 16, 2008

(65) Prior Publication Data

US 2010/0060841 A1 Mar. 11, 2010

(30) Foreign Application Priority Data

Sep. 9, 2008 (TW) ................................ 97134607 A

(51) Int. Cl.
*G02F 1/1345* (2006.01)
*G09G 3/36* (2006.01)
*G06F 1/16* (2006.01)
(52) U.S. Cl. ....................... 349/150; 345/90; 361/679.21
(58) Field of Classification Search .................. 349/150; 345/90; 361/679.21
See application file for complete search history.

(56) References Cited

U.S. PATENT DOCUMENTS

| | | | |
|---|---|---|---|
| 7,245,015 B2 * | 7/2007 | Hwang et al. | 257/756 |
| 7,444,772 B2 * | 11/2008 | Harasawa et al. | 40/586 |
| 7,492,434 B2 * | 2/2009 | Kudo et al. | 349/152 |
| 7,847,904 B2 * | 12/2010 | Kimura | 349/141 |
| 2007/0008465 A1 * | 1/2007 | Ding et al. | 349/113 |

* cited by examiner

*Primary Examiner* — Mike Qi
(74) *Attorney, Agent, or Firm* — Chun-Ming Shih

(57) ABSTRACT

A flexible display panel comprises a flexible substrate, a display module, a driving unit and at least one anisotropic conductive film. The display module is disposed on the flexible substrate, and has a display area and a peripheral circuit area beside the display area. The anisotropic conductive film is connected between the peripheral circuit area and the driving unit, and the driving unit is electrically connected to the peripheral circuit area through the anisotropic conductive film. In addition, the anisotropic conductive film has an insulation film and a plurality of conductive particles disposed in the insulation film. Diameters of the conductive particles are in a range from 4.5 micrometers to 7 micrometers, and a distribution density of the conductive particles is a range from 45000 grains per square millimeter to 65000 grains per square millimeter. Therefore, the flexible display panel has high reliability.

9 Claims, 3 Drawing Sheets

FLEXIBLE DISPLAY PANEL HAVING PARTICULAR ANISOTROPIC CONDUCTIVE FILM

BACKGROUND

1. Field of the Invention

The present invention relates to a display device, and more particularly, to a flexible display panel.

2. Description of the Related Art

With the advancement of the flat display technology, more and more electrical products, especially portable electrical products such as mobile phones, e-books, digital cameras and personal digital assistants etc., are equipped with flat display devices. Since the portable electrical products are developed in a trend of light-weight and thin-thickness, the display devices applied to the portable electrical products must have advantages of light-weight and thin-thickness.

The flexible display panel, such as flexible electrophoretic display panel (flexible EPD panel) and flexible liquid crystal display panel (flexible LCD panel), etc., not only has features of light-weight and thin-thickness, but also has features of flexibility and hard to be broken. Thus, the development of the flexible display device has become increasingly important.

The flexible display panel generally employs a plastic substrate to replace the conventional glass substrate. However, compared with the glass substrate, the hardness of the plastic substrate is low. If employing the conventional technology of chip on glass (COG) or the technology of flexible circuit board on glass (FOG) to join the driving unit of the flexible display panel with the plastic substrate, it will produce a problem of bad reliability.

More specifically, for the anisotropic conductive film used in the conventional technology of COG or the conventional technology of FOG, the diameters of the conductive particles of the anisotropic conductive film are from 3 micrometers to 4 micrometers, and the distribution density of the conductive particles of the anisotropic conductive film is about 32000 grains per square millimeter. After replacing the glass substrate by the plastic substrate, if employing the conventional anisotropic conductive film to join the driving unit and the plastic substrate, it is prone to break the metal lines of the flexible display panel configured for being electrically connected to the driving unit, or to immerse the conductive particles into the plastic substrate. Thus, electrical contact between the driving unit and the plastic substrate is poor, and the reliability of the flexible display panel is consequently reduced.

In addition, the hot-pressing pressure of the conventional joining process for joining the driving unit and the plastic substrate is about 0.8 MPa, and the hot-pressing temperature thereof is about 210 centigrade degrees. It needs reduce the hot-pressing pressure and the hot-pressing temperature to prevent the metal lines from being broken or prevent the conductive particles from being immersed into the plastic substrate. However, reducing the hot-pressing pressure and the hot-pressing temperature cannot effectively prevent the metal lines from being broken or prevent the conductive particles from being immersed into the plastic substrate. In addition, when the pressure is reduced below 0.2 MPa, the reliability of the joining process for joining the driving unit and the plastic substrate is reduced. When the temperature is relatively low, the anisotropic conductive film may be incompletely cured.

BRIEF SUMMARY

The present invention relates to a flexible display panel having high reliability.

To achieve the above advantages, a flexible display panel in accordance with an exemplary embodiment of the present invention is provided. The flexible display panel comprises a flexible substrate, a display module, a driving unit and at least one anisotropic conductive film. The display module is disposed on the flexible substrate, and has a display area and a peripheral circuit area beside the display area. The anisotropic conductive film is connected between the peripheral circuit area and the driving unit, and the driving unit is electrically connected to the peripheral circuit area through the anisotropic conductive film. In addition, the anisotropic conductive film has an insulation film and a plurality of conductive particles disposed in the insulation film. Diameters of the conductive particles are in a range from 4.5 micrometers to 7 micrometers, and a distribution density of the conductive particles is in a range from 45000 grains per square millimeter to 65000 grains per square millimeter.

In an embodiment of the present invention, the driving unit comprises at least one flexible circuit board and at least one driving chip. The flexible circuit board is connected to the peripheral circuit area and contacts the anisotropic conductive film for being electrically connected to the peripheral circuit area through the anisotropic conductive film. The driving chip is disposed on the flexible circuit board and is electrically connected to the flexible circuit board.

In an embodiment of the present invention, the driving unit comprises at least one driving chip disposed on the peripheral circuit area and contacting the anisotropic conductive film for being electrically connected to the peripheral circuit area through the anisotropic conductive film. In addition, the driving unit further comprises at least one flexible circuit board connected to the peripheral circuit area and contacting the anisotropic conductive film for being electrically connected to the peripheral circuit area through the anisotropic conductive film.

In an embodiment of the present invention, the diameters of the conductive particles are in a range from 5 micrometers to 6 micrometers.

In an embodiment of the present invention, the distribution density of the conductive particles is in a range from 50000 grains per square millimeter to 55000 grains per square millimeter.

In an embodiment of the present invention, the display module is an electrophoretic display module or a liquid crystal display module.

In an embodiment of the present invention, the flexible substrate is a plastic substrate.

In an embodiment of the present invention, the flexible display panel further comprises an insulation layer disposed between the flexible substrate and the display module.

Compared with the conventional art, since the diameters of the conductive particles of the anisotropic conductive film are larger and the distribution density of the conductive particles is higher, when joining the driving unit and the peripheral circuit area, they can effectively prevent the metal lines from being broken or prevent the conductive particles from being immersed into the flexible substrate. Therefore, the flexible display panel of the present invention has high reliability.

BRIEF DESCRIPTION OF THE DRAWINGS

The accompanying drawings are included to provide a further understanding of the invention, and are incorporated in and constitute part of this specification. The drawings illustrate embodiments of the invention and, together with the description, serve to explain the principles of the invention.

DETAILED DESCRIPTION

Reference will now be made to the drawings to describe exemplary embodiments of the present flexible display panel, in detail. The following description is given by way of example, and not limitation.

Figure 1:
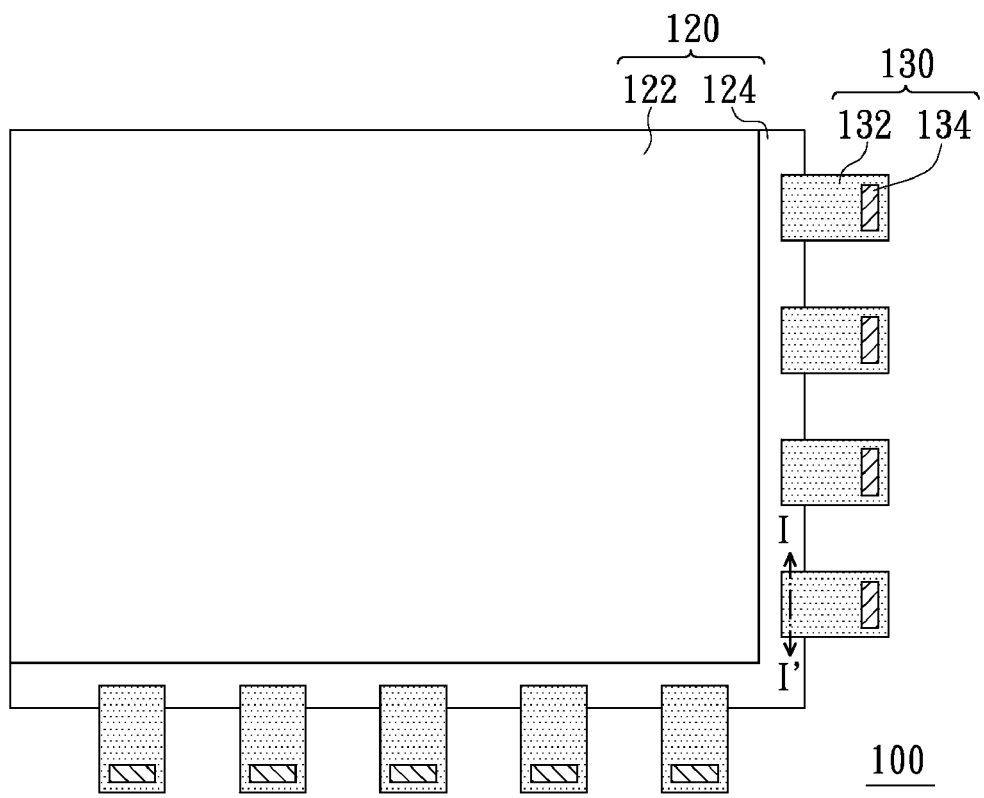
FIG. 1 is a schematic, top view of a flexible display panel in accordance with a first exemplary embodiment of the present invention.
Figure 2:
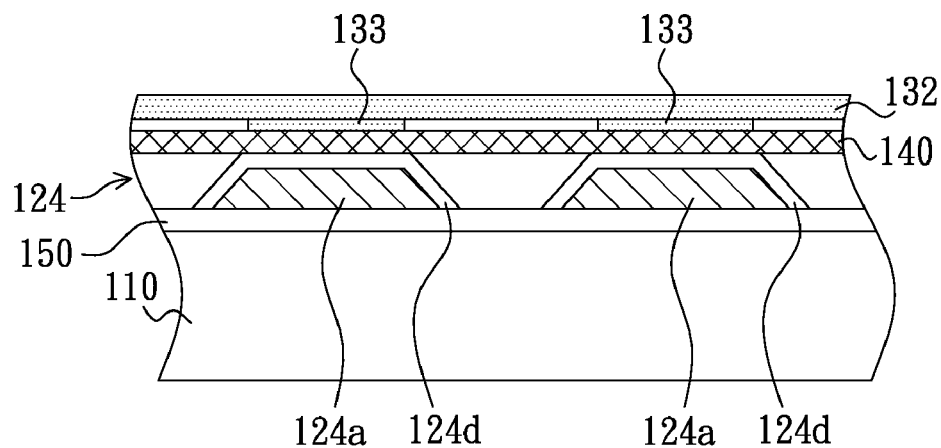
FIG. 2 is a schematic, cross-sectional view along a line I-I' of FIG. 1.

FIG. 1 is a schematic, top view of a flexible display panel in accordance with a first exemplary embodiment of the present invention, and FIG. 2 is a schematic, cross-sectional view along a line I-I' of FIG. 1. Referring to FIGS. 1 and 2, the flexible display panel 100 of the present embodiment includes a flexible substrate 110, a display module 120, a driving unit 130 and an anisotropic conductive film 140. The display module 120 is disposed on the flexible substrate 110 and includes a display area 122 and a peripheral circuit area 124 beside the display area 122. The anisotropic conductive film 140 is connected between the peripheral circuit area 124 and the driving unit 130, and the driving unit 130 is electrically connected to the peripheral circuit area 124 through the anisotropic conductive film 140.

In the flexible display panel 100, the flexible substrate 110 may be a plastic substrate, and the plastic substrate may be made of polyimide. An insulation layer 150 can be disposed between the flexible substrate 110 and the display module 120. In addition, the display module 120 may be an electrophoretic display module or a liquid crystal display module. In the embodiment of the display module 120 being the electrophoretic display module, the display area 122 includes a driving circuit layer, an electrophoretic layer disposed on the driving circuit layer, and a protective film disposed on the electrophoretic layer. In the embodiment of the display module 120 being the liquid crystal display module, the display area includes a driving circuit layer, a liquid crystal layer disposed on the driving circuit layer, and an opposite substrate disposed on the liquid crystal layer. The opposite substrate may include a color filter film, and may include a flexible substrate. Since the detailed structures of the electrophoretic display module and the liquid crystal display module are obvious for the persons skilled in the art, detailed description and drawing are omitted.

The driving unit 130 includes at least one flexible circuit board 132 and at least one driving chip 134. In the present embodiment, there are a plurality of flexible circuit boards 132 and a plurality of driving chips 134 for an example. The driving chips 134 are disposed on the flexible circuit boards 132 respectively, and are electrically connected to the flexible circuit boards 132. In addition, the flexible circuit boards 132 are connected to the peripheral circuit area 124 and contact the anisotropic conductive film 140 for being electrically connected to the peripheral circuit area 124 through the anisotropic conductive film 140. Another ends of the flexible circuit boards 132 may be electrically connected to an outer circuit. More specifically, the peripheral circuit area 124 may includes a plurality of metal lines 124a (only two metal lines 124a shown in FIG. 2) disposed on the insulation layer 150, and a plurality of transparent electrodes 124b disposed on the metal lines 124a respectively. The anisotropic conductive film 140 is disposed on the transparent electrodes 124b. Connection terminals 133 of the flexible circuit boards 132 are electrically connected to the metal lines 124a of the peripheral circuit area 124 through the anisotropic conductive film 140 and the transparent electrodes 124d. It should be noted that, the above structure of the peripheral circuit area 124 is only an example, and the present invention does not limit the structure of the peripheral circuit area 124.

Figure 3:
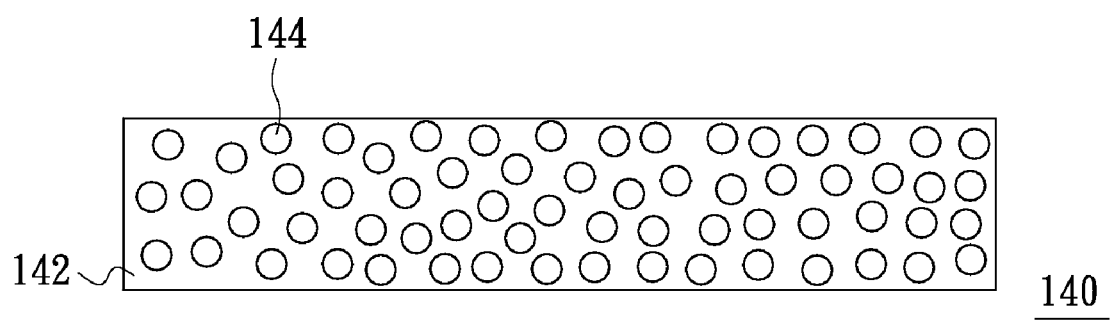
FIG. 3 is a schematic view of an anisotropic conductive film of the flexible display panel of the first exemplary embodiment of the present invention.

FIG. 3 is a schematic view of the anisotropic conductive film of the flexible display panel of the first exemplary embodiment of the present invention. Referring to FIGS. 2 and 3, the anisotropic conductive film 140 of the present embodiment includes an insulation film 142 and a plurality of conductive particles 144 disposed in the insulation film 142. The diameters of the conductive particles 144 are in a range from 4.5 micrometers to 7 micrometers, preferably, in a range from 5 micrometers to 6 micrometers. In addition, the distribution density of the conductive particles 144 is in a range from 45000 grains per square millimeter to 65000 grains per square millimeter, preferably, in a range from 50000 grains per square millimeter to 55000 grains per square millimeter.

Compared with the conventional art, since the diameters of the conductive particles 144 of the anisotropic conductive film 140 of the present embodiment are larger, and the distribution density of the conductive particles 144 is higher, when performing the hot-pressing process to join the flexible circuit board 132 and the peripheral circuit area 124, they can effectively prevent the metal lines 124a from being broken or prevent the conductive particles 144 from being immersed into the insulation layer 150 and the flexible substrate 110. Thus, electrical contact between the flexible circuit board 132 and the peripheral circuit area 124 is improved. Therefore, the flexible display panel 100 of the present embodiment has high reliability. In addition, in the present embodiment, when performing the hot-pressing process, the hot-pressing temperature can be in a range from 150 centigrade degrees to 210 centigrade degrees, and the hot-pressing pressure can be in a range from 0.5 MPa to 1 MPa.

It should be noted that, when the distribution density of the conductive particles 144 is too high (above 65000 grains per square millimeter), the conductive particles 144 are prone to be concentrated due to the conductive particles 144 having slight charges, and it will badly affect the conductive capability of the anisotropic conductive film 140. In addition, generally, the widths of the metal lines 124a are about in a range from 15 micrometers to 20 micrometers, and the interval between every two adjacent metal lines 124a is about in a range from 10 micrometers to 15 micrometers. When the diameters of the conductive particles 144 are too large (above 7 micrometers), it is prone to occur the short circuit fault between two adjacent metal lines 124a.

Figure 4:
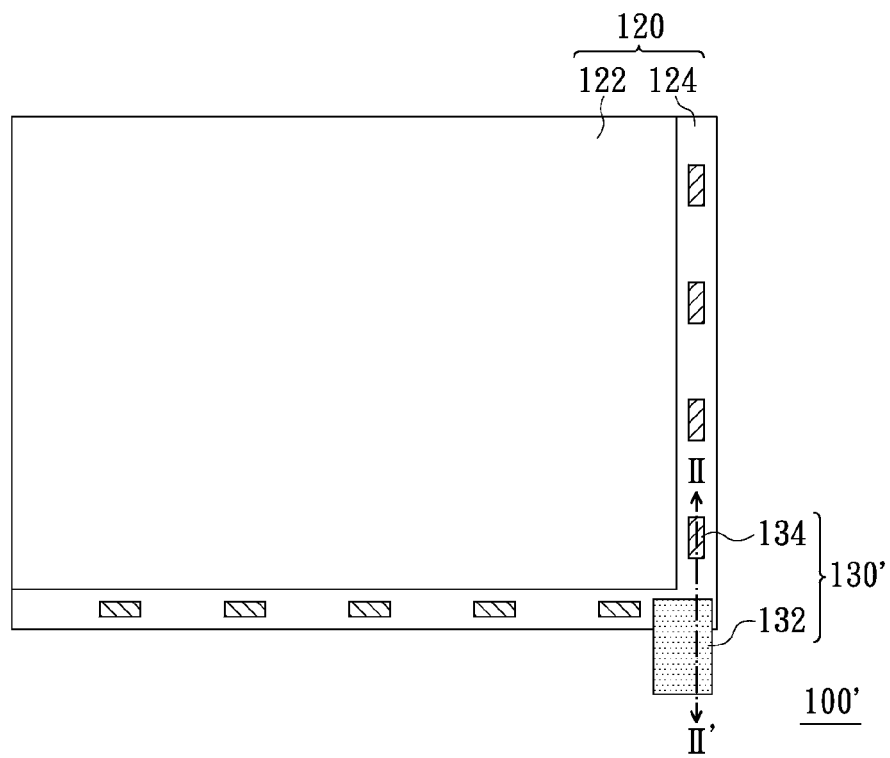
FIG. 4 is a schematic view of a flexible display panel in accordance with a second exemplary embodiment of the present invention.
Figure 5:
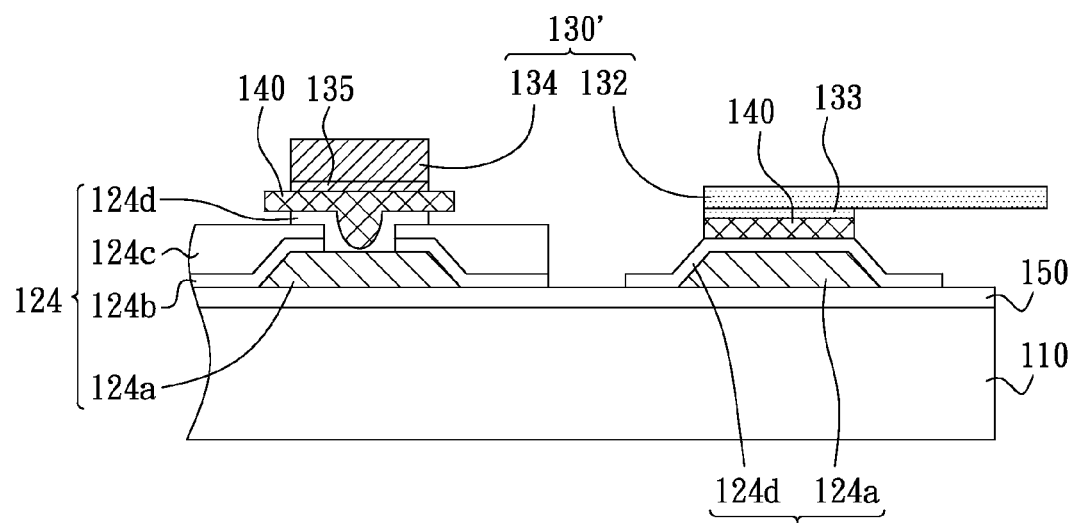
FIG. 5 is a schematic, cross-sectional view along a line II-II' of FIG. 4.

FIG. 4 is a schematic view of a flexible display panel in accordance with a second exemplary embodiment of the present invention, and FIG. 5 is a schematic, cross-sectional view along a line II-II' of FIG. 4. Referring to FIGS. 4 and 5, the flexible display panel 100' of the present exemplary embodiment is similar to the flexible display panel 100 of the first exemplary embodiment, except the driving unit. More specifically, the driving unit 130' of the flexible display panel 100' includes at least one driving chip 134. In the present exemplary embodiment, there is a plurality of driving chips 134 for an example. The driving chips 134 are disposed on the peripheral circuit area 124 and contact the anisotropic conductive film 140 for being electrically connected to the peripheral circuit area 124 through the anisotropic conductive film 140. In addition, the driving unit 130' may further include at least one flexible circuit board 132. In the present exemplary embodiment, there is a flexible circuit board 132 for an example. The flexible circuit board 132 is connected to the peripheral circuit area 124 and contacts the anisotropic conductive film 140 for being electrically connected to the peripheral circuit area 124 through the anisotropic conductive film 140. More specifically, the peripheral circuit area 124 may include a plurality of metal lines 124a (only two metal lines 124a shown in FIG. 5) disposed on the insulation layer 150. An insulation layer 124b is disposed on a part of the metal lines 124a (e.g. the left metal line 124a shown in FIG. 5), and a protective layer 124c covers the insulation layer 124b. The insulation layer 124b and the protective layer 124c expose portions of the metal lines 124a which are covered by the insulation layer 124b and the protective layer 124c. In addition, the peripheral circuit area 124 further includes a plurality of transparent electrodes 124d, which are connected to the metal lines 124a respectively. Bumps 135 of the driving chips 134 are electrically connected to the metal lines 124a of the peripheral circuit area 124 through the anisotropic conductive film 140 and the transparent electrodes 124d. The connection terminal 133 of the flexible circuit board 132 is electrically connected to the metal lines 124a of the peripheral circuit area 124 through the anisotropic conductive film 140 and the transparent electrodes 124d.

The advantages of the flexible display panel 100' of the present exemplary embodiment are similar to those of the flexible display panel 100 of the first exemplary embodiment, and are not re-described thereinafter.

In summary, in the present invention, the diameters of the conductive particles of the anisotropic conductive film are in the range from 4.5 micrometers to 7 micrometers, and the distribution density of the conductive particles is in the range from 45000 grains per square millimeter to 65000 grains per square millimeter. Compared with the conventional art, since the diameters of the conductive particles of the anisotropic conductive film are larger and the distribution density of the conductive particles is higher, when joining the driving unit and the peripheral circuit area, they can effectively prevent the metal lines from being broken or prevent the conductive particles from being immersed into the flexible substrate. Therefore, the flexible display panel of the present invention has high reliability.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A flexible display panel, comprising:
    a flexible substrate;
    a display module disposed on the flexible substrate, the display module having a display area and a peripheral circuit area beside the display area;
    a driving unit; and
    at least one anisotropic conductive film connected between the peripheral circuit area and the driving unit, the driving unit being electrically connected to the peripheral circuit area through the anisotropic conductive film, the anisotropic conductive film having an insulation film and a plurality of conductive particles disposed in the insulation film, wherein diameters of the conductive particles are in a range from 4.5 micrometers to 7 micrometers and a distribution density of the conductive particles is in a range from 45000 grains per square millimeter to 65000 grains per square millimeter.

2. The flexible display panel as claimed in claim 1, wherein the driving unit comprises:
    at least one flexible circuit board connected to the peripheral circuit area and contacting the anisotropic conductive film for being electrically connected to the peripheral circuit area through the anisotropic conductive film; and
    at least one driving chip disposed on the flexible circuit board and electrically connected to the flexible circuit board.

3. The flexible display panel as claimed in claim 1, wherein the driving unit comprises at least one driving chip disposed on the peripheral circuit area and contacting the anisotropic conductive film for being electrically connected to the peripheral circuit area through the anisotropic conductive film.

4. The flexible display panel as claimed in claim 3, wherein the driving unit further comprises at least one flexible circuit board connected to the peripheral circuit area and contacting the anisotropic conductive film for being electrically connected to the peripheral circuit area through the anisotropic conductive film.

5. The flexible display panel as claimed in claim 1, wherein the diameters of the conductive particles are in a range from 5 micrometers to 6 micrometers.

6. The flexible display panel as claimed in claim 1, wherein the distribution density of the conductive particles is in a range from 50000 grains per square millimeter to 55000 grains per square millimeter.

7. The flexible display panel as claimed in claim 1, wherein the display module is one of an electrophoretic display module and a liquid crystal display module.

8. The flexible display panel as claimed in claim 1, wherein the flexible substrate is a plastic substrate.

9. The flexible display panel as claimed in claim 1, further comprising an insulation layer disposed between the flexible substrate and the display module.

* * * * *